United States Patent
Sakai et al.

(10) Patent No.: US 8,478,078 B2
(45) Date of Patent: Jul. 2, 2013

(54) PATTERN-SEARCHING CONDITION DETERMINING METHOD, AND PATTERN-SEARCHING CONDITION SETTING DEVICE

(75) Inventors: Kei Sakai, Hitachinaka (JP); Fumihiro Sasajima, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 255 days.

(21) Appl. No.: 13/122,731

(22) PCT Filed: Oct. 2, 2009

(86) PCT No.: PCT/JP2009/067227
§ 371 (c)(1),
(2), (4) Date: Apr. 22, 2011

(87) PCT Pub. No.: WO2010/041596
PCT Pub. Date: Apr. 15, 2010

(65) Prior Publication Data
US 2011/0194778 A1    Aug. 11, 2011

(30) Foreign Application Priority Data
Oct. 6, 2008 (JP) .................................. 2008-259178

(51) Int. Cl.
*G06K 9/32* (2006.01)
(52) U.S. Cl.
USPC ........... 382/298; 382/181; 382/219; 382/278; 345/617; 345/619
(58) Field of Classification Search
USPC .. 382/181, 190, 209, 219, 278, 298; 345/617, 345/618, 619
See application file for complete search history.

(56) References Cited

U.S. PATENT DOCUMENTS

| 7,054,506 B2 * | 5/2006 | Ikku .............................. 382/286 |
| 7,072,398 B2 * | 7/2006 | Ma ........................... 375/240.16 |
| 7,430,319 B2 * | 9/2008 | Hyoki et al. .................. 382/168 |
| 7,756,318 B2 * | 7/2010 | Nakatani ....................... 382/141 |
| 7,943,400 B2 * | 5/2011 | Nataraj ............................ 438/4 |
| 2005/0232493 A1 | 10/2005 | Satou et al. |
| 2008/0069453 A1 | 3/2008 | Abe et al. |

FOREIGN PATENT DOCUMENTS

| JP | 63-211474 A | 9/1988 |
| JP | 6-120310 A | 4/1994 |
| JP | 2005-310805 A | 11/2005 |
| JP | 2007-324467 A | 12/2007 |
| JP | 2008-065458 A | 3/2008 |

* cited by examiner

Primary Examiner — Yosef Kassa
(74) Attorney, Agent, or Firm — Miles & Stockbridge P.C.

(57) ABSTRACT

Provided is a method for determining the magnification of a pattern searching template of a scanning electron microscope. The determining method comprises: acquiring a first image initially at a first magnification; then acquiring a second image which contains a pattern image displayed on the first image at a second magnification lower than the first magnification; making the size of the first image coincident with the size of a third image which cut out a portion of the second image; thereafter determining the correlation value between the first image and the third image; and setting the second magnification as the magnification of a pattern searching template, in the case where the correlation value is equal to or higher than a predetermined value. As a result, a condition for acquiring a search area can be properly set, when pattern recognition is performed by means of the template.

8 Claims, 5 Drawing Sheets

IMAGE A AT A MEASUREMENT MAGNIFICATION (MagA) → REDUCED IMAGE A'

REDUCTION TO MagA/MagB

CUT OUT A PORTION CORRESPONDING TO A REDUCED IMAGE A'

IMAGE B

CUT OUT IMAGE B'

IMAGE B — PATTERN RECOGNITION — IMAGE B' FOR 1 FRAME

PATTERN-SEARCHING CONDITION DETERMINING METHOD, AND PATTERN-SEARCHING CONDITION SETTING DEVICE

TECHNICAL FIELD

The present invention relates to a pattern recognition method for detecting a desired pattern from an image acquired by a scanning electron microscope or the like, and a device thereof, in particular, the present invention relates to a method for determining a condition in carrying out the relevant pattern recognition, and a device thereof.

BACKGROUND ART

In a device to be used in measurement or inspection of a semiconductor device, in order to automatically measure or inspect a pattern on a sample, a method for automatically searching a pattern to be a measuring object or a pattern of position specification, is employed.

In the relevant method, a search is carried out using a template registered in advance, to acquire an image (image at a low magnification) of a wide area and extract a desired shape from the inside of the relevant area, for a pattern of a search object. In Patent Literature 1, on determination of a size of such a search view, explanation has been given that a size of search view is determined with such a size that the desired pattern is sufficiently included in the search view and a pattern having a relatively approximate evaluation value is not detected.

CITATION LIST

Patent Literature

[Patent Literature 1]: JP-A-2007-324467

SUMMARY OF INVENTION

Technical Problem

As the size of the above search area (a magnification in forming an image of the relevant area), a certain degree of a large area should be selected, so that the pattern to be the search object does not go off to outside of the search area. In Patent Literature 1, explanation has been given on setting the search area so as to widen a search range, in the case where one coincident with the template is not present in the view (one having a correlation value equal to or higher than the predetermined value is not present in the area). Such a determination method has difficulty in setting more search areas than area judged that the pattern to be the search object is present. In view of increasing success rate of search by means of the template, irrespective of stop precision of a stage or error in alignment of a sample or the like, a area as wider as possible should be set as a area for pattern search, however, technology disclosed in Patent Literature 1 had difficulty in setting such a wide range of an area.

Explanation will be given below on the method for setting pattern-searching condition aiming at suitably setting acquiring condition of a search area in carrying out pattern recognition by the template, and the device thereof.

Solution to Problem

As one aspect for attaining the object, explanation will be given below on the method having: a step of acquiring a first image obtained by scanning a charged particle beam at a first magnification; and a step of acquiring at a second magnification lower than the first magnification a second image which contains a pattern image displayed on the first image; and making a size of the first image coincident with a size of a third image which cut out a portion of the second image, and setting the second magnification as a magnification in acquiring an image to be searched in the pattern searching in the case where a correlation value between the both is equal to or higher than the predetermined value, in the method for setting pattern-searching condition, and the device thereof.

In addition, explanation will also be given on a method for setting a frame number.

Advantageous Effects of Invention

According to the above configuration, it becomes possible to acquire an image to be searched for pattern search at a suitable magnification, and as a result it becomes possible to suppress generation of detection error in pattern search.

Other objects, features and advantages of the present invention will become apparent from the following description of the Embodiments of the present invention in relation to the accompanying drawings.

DESCRIPTION OF EMBODIMENTS

Figure 1:
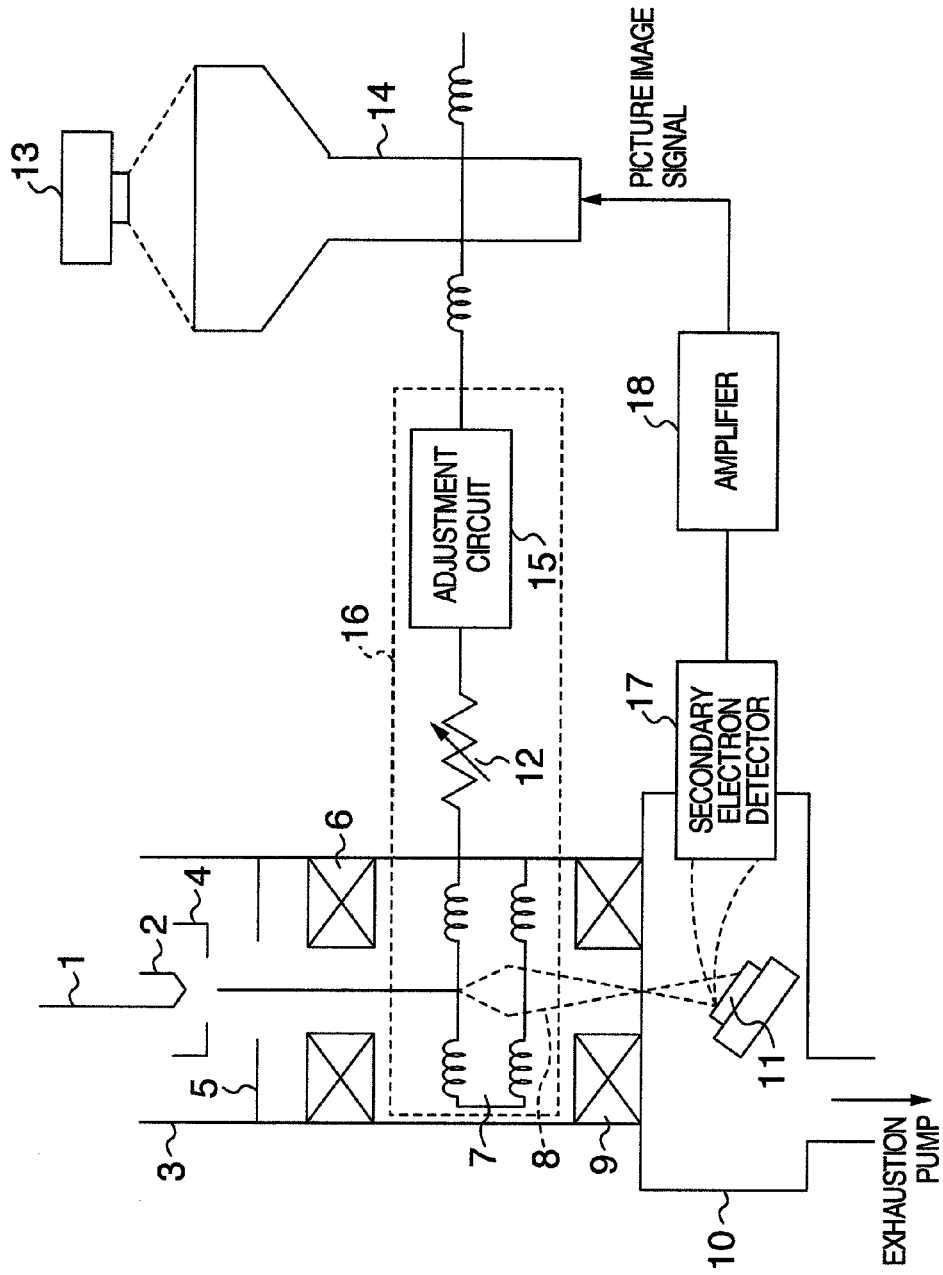
FIG. 1 is a schematic diagram of a scanning electron microscope.

In a semiconductor measurement and a detection device, pattern recognition for pattern position detection is carried out in measuring a pattern line width or a hole diameter on a wafer automatically and continuously. Registration of measurement conditions and imaging conditions of the pattern should be carried out before measurement in advance. When registration processing can be set under suitable conditions, continuous measurement can be carried out without error detection of a measuring point. The automatic measurement processing is carried out in the order of carrying out addressing for performing measurement position detection after alignment for correction of wafer rotation, detecting a length measurement pattern, setting arrangement position of a cursor, and carrying out length measurement.

A pattern search method to be used in position detection of a length measurement pattern or the like has the following problem. For example, it is required to carry out automatically position determination of a measurement pattern, in automatically measuring a pattern on a semiconductor wafer, however, there is the case where a pattern position cannot be specified correctly, depending on setting of imaging conditions of the magnification and the frame number of an image to be acquired in pattern recognition. The frame number described here is a scanning number of times of electron beams to be scanned onto the pattern in imaging the pattern, and an image of one frame is an image acquired by scanning the electron beams one time onto the pattern.

For example, the too low setting magnification results in decrease in texture of the measured pattern, and therefore cannot recognize the pattern well, and may detect position of a pattern different from an objective pattern. In addition, the too high setting magnification cannot put the objective pattern within a viewing field, and thus may be impossible to carry out pattern recognition sometimes, depending on stop precision of a stage. Further, the too high magnification could increase energy density of electron beams to be irradiated onto the pattern, and could give damage on the pattern.

As for the frame number setting, the too small frame number may bring about error detection of a measured position, due to difficulty in distinguishing a pattern and a noise, caused by influence of the noise. The too many frame number is capable of acquiring an image with a decreased noise, however, results in irradiation of electron beams on the pattern for a long period of time, thus giving damage on the measured pattern. In addition, the too many frame number for imaging provides increase in imaging time of the pattern and decrease in throughput.

From these facts, when imaging of the pattern and pattern recognition can be carried out at the suitable magnification and frame number, error detection of the pattern can be prevented, damage of the pattern can be suppressed to the minimum, and a semiconductor detection device can be operated in high throughput.

The following explanation relates to a method for enabling to attain prevention of detection miss in pattern position detection, higher speed processing accompanying with pattern detection, reduction of damage onto the pattern and simplification of user work in pattern registration, by automatic setting of the suitable magnification and frame number of an image to be imaged in pattern recognition.

According to a method to be explained below, optimum imaging conditions can be set automatically, in detection of a pattern for detecting a measurement position of the semiconductor pattern. In automatic setting of the magnification and frame number, in registration of the template by position detection processing of a measured pattern, as for setting of the magnification, when pattern recognition result is equal to or higher than the predetermined value in carrying out pattern recognition by means of an image reduced an image of the measurement magnification, and an inspected image of the magnification set based on stop precision of the stage, the magnification thereof is set.

An image acquired at the measurement magnification is the image where texture of the predetermined pattern is sufficiently expressed, and based on comparison with the relevant image as a standard, the magnification where the texture is sufficiently expressed can be searched. In this case, by selecting a suitable magnification in the order of a magnification candidate with a lower magnification, an area where the texture is sufficiently expressed and has a wide range may be possible to be set as the magnification of an image for pattern recognition.

As for the frame number setting, by carrying out pattern recognition with an image having the frame number in imaging in pattern measurement at the magnification set above, and an image having a low frame number determined in advance, and when pattern recognition result is equal to or higher than the predetermined value, the frame number thereof is set.

According to such a configuration, it is possible to set a suitable magnification and a frame number as imaging conditions in pattern recognition. By setting the suitable magnification and frame number, detection miss in pattern recognition during automatic measurement processing can be prevented. In addition, in pattern recognition, by setting the frame number as few as possible, imaging time can be shortened, and throughput can be enhanced. Because registration for pattern position detection is carried out automatically, it is possible to set the magnification and the frame number without depending on degree of skill of a user, and reduce load of a device operator.

Explanation will be given below on a method for determining conditions in acquiring an image to be searched of pattern search, and a device thereof, with reference to drawings.

FIG. 1 is a schematic diagram of a scanning electron microscope, which is one example of a semiconductor measurement or inspection device.

Electron beam 8 obtained by heating a heating filament 2 under high voltage (500 V or higher) and thereafter drawing out from an electron gun 1 by a Wehnelt 4, is accelerated by an anode 5. This electron beam 8 is converged with a condenser lens 6. A scanning deflector 7 is one for scanning the electron beam 8 one-dimensionally or two-dimensionally on a sample, and for example, scans the beam using a lens main surface of an objective lens 9 as a deflection fulcrum. Further, focusing is carried out in the objective lens 9 for scanning one dimensionally or two dimensionally on a fine pattern engraved on a sample 11 inside a sample room 10. By irradiation of the electron beam 8, secondary electrons generate from the vicinity of the surface of the sample 11, in a quantity corresponding to the shape thereof. The secondary electrons generated from the vicinity of the surface of the sample 11 are detected by a secondary electron detector 17. The secondary electrons detected are amplified with an amplifier 18, to become a brightness modulation signal of a CRT 14. The CRT 14 is synchronized with a signal emitted by a deflected signal generator 16, in which a magnification adjuster 12 and an adjustment circuit 15 are built-in, and the brightness modulation signal reproduces the secondary electron image generated from the surface part of the sample 11, by the electron beam 8 irradiated in synchronization. By the above procedure, information on the sample surface can be acquired.

In addition, a control device not shown is connected to the scanning electron microscope exemplified in FIG. 1, and in the relevant control device, a program for carrying out pattern matching for searching a desired pattern is registered, and a calculation device for running the relevant program is built-in. The control device provided with this calculation device becomes a setting device of pattern-searching condition to be described later.

The above program is one for searching a desired position, based on calculation of coincidence degree between a SEM image acquired with the scanning electron microscope, and a template registered in advance. For example, as for pattern matching, pattern matching processing is carried out after performing edge extraction processing on each of the template registered in advance and the SEM image, and then performing smoothing processing for both to complement shape difference between them. Naturally, the matching may be carried out between vector data. It is also possible to apply other existing matching methods.

In addition, explanation will be given below on algorism where the magnification or the frame number for acquiring an image to be searched is determined automatically, however, the magnification or the frame number determined automatically can also be registered automatically in a program, which specifies action conditions of the scanning electron microscope, called a recipe. The magnification is one representing a ratio of a size of a deflection area of the electron beams 8, which is deflected with the scanning deflector 7, and an image displayed on the CRT 14 by the relevant deflection, and on the premise that the size of the relevant image is fixed, the magnification is determined by the size of the deflection signal of the scanning deflector 7. In addition, the frame number is a signal number to be added for image formation, and becomes a value proportional to scanning number of times by the scanning deflector 7. By integrating the signals acquired in a plurality of frames, it becomes possible to form an image with a high S/N ratio.

Figure 2:
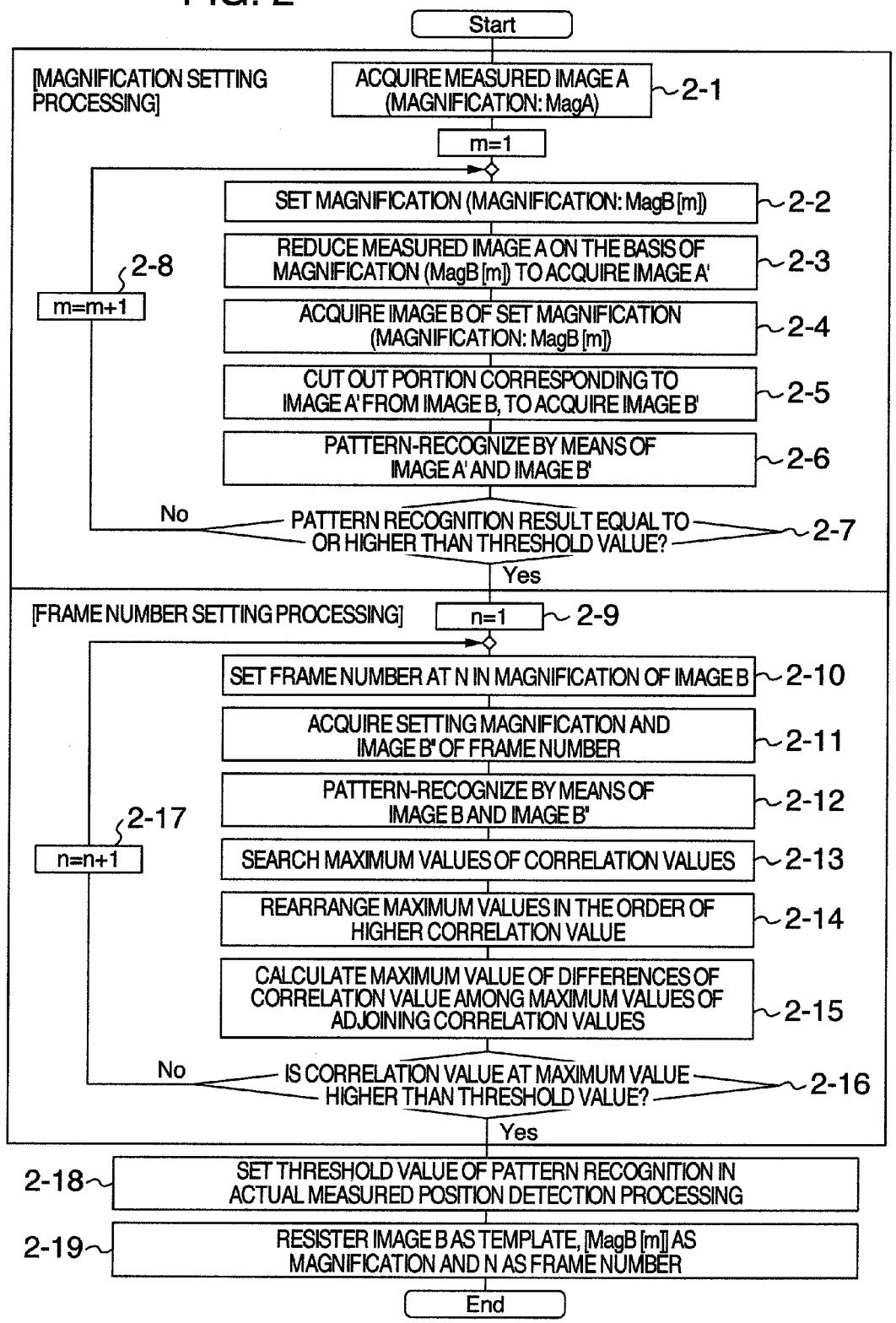
FIG. 2 is a flowchart showing steps of determining a magnification and a frame number of an image to be searched for pattern recognition.

A processing flow for automatically setting the magnification and the frame number in carrying out pattern recognition in pattern position detection is shown below in FIG. 2, and auxiliary explanation of the flow chart is shown in FIG. 2 to FIG. 6.

Firstly, in the step 2-1 of FIG. 2, registration of a viewing magnification of the measurement pattern, the frame number and measurement kinds or the like is carried out, to acquire a measured image A. Next, in the step 2-2, the magnification of pattern recognition in detecting a measurement position is set. The magnification can be calculated by the following equation (1):

[Math. 1]

$$MagB = MagA \times \left\{ \frac{FOV\_A}{\left(\frac{X}{Err}\right) \times 100} \right\}$$ Equation (1)

wherein
MagB: Magnification in pattern recognition
MagA: Measurement magnification
FOV_A: Field of view in the measurement magnification [m]
X: Maximum deviation amount of a stage (stage precision) [m]
Err: Allowable rate of the deviation amount of the stage in vertical and horizontal directions [%].

Figure 3:
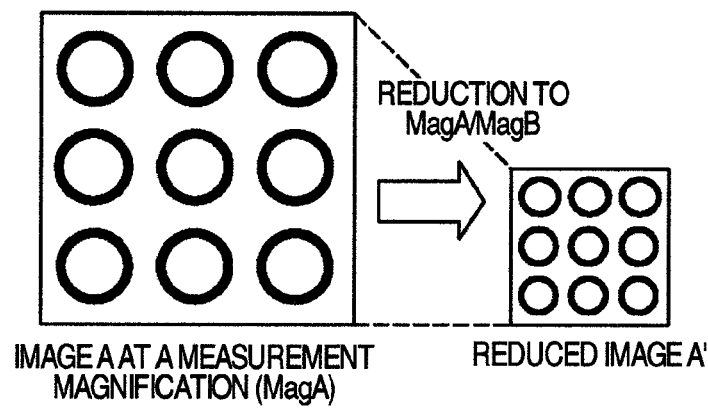
FIG. 3 is a drawing explaining an example formed a reduced image by reducing a measured image.

For example, in the case where the measurement magnification is 200 k, the field of view in the measurement magnification is 100 nm, stop precision of the stage is 100 nm, and an allowable range of the deviation amount of the stage in vertical and horizontal directions is 25%, the image magnification in pattern recognition can be set at 50 k. In the step 2-3, as shown in FIG. 3, it is set that the measurement magnification is MagA, the magnification set at the stage 2-2 is MagB, and the measured image A is reduced to a ratio of MagA/MagB to generate a reduced image A'. Subsequently, in the step 2-4, by setting imaging conditions at the magnification of MagB and the frame number at the frame number in measurement, the image B is acquired.

Figure 4:
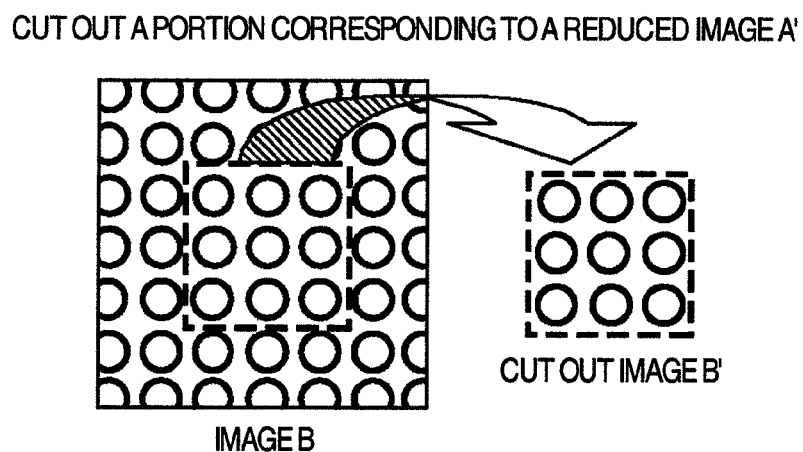
FIG. 4 is a drawing explaining an example of cutting out a point corresponding to an image at a measurement magnification, from an image to be searched area for pattern recognition.

In the step 2-5, as shown in FIG. 4, a place corresponding to the reduced image A' is cut out from the image B to generate the image B'. For example, when the magnification of the image B is ½ of the measurement magnification, an image with a size of ½ each longitudinally and laterally is cut out from the center of the image.

Here, in the step 2-6, pattern recognition is carried out by means of the image A' and the image B'. Here, as for the correlation value of pattern recognition, a normalized correlation method to be used in general pattern detection may be used.

In the step 2-7, when pattern recognition result is equal to or higher than the predetermined threshold value, it is judged that texture of measured pattern has not been destructed in the magnification MagB, and it is set as the magnification of pattern recognition in detection of measured pattern position. The threshold value for judging on whether texture has been destructed or not, can be determined arbitrarily, such as ½ of the maximum value of the correlation value determined by the normalized correlation method. In addition, image processing of the image A' and the image B' can also be carried out aiming at removing a noise of the image before performing pattern recognition, or aiming at emphasizing an edge of the pattern.

In the case where pattern recognition result is equal to or lower than the threshold value, it can be judged that texture of the measured pattern has been destructed in the magnification MagB. In that case, the magnification is further increased in the step 2-8 to carry out magnification setting processing again. In the case when the pattern is scanned at a decreased magnification, because amount of electrons irradiated onto the pattern decreases, amount of the secondary electrons emitted from the pattern is also decreased. Therefore, edge information of the pattern detectable at a high magnification results in to be decreased at a low magnification, and texture may be destructed sometimes.

Here, the upper limit of the magnification settable shall be the maximum magnification allowable of stage precision. When the maximum deviation amount in stage transfer is set at 50% of the field of view, it can be calculated from the equation (1). For example, in the case where the measurement magnification is 200 k, the field of view at the measurement magnification is 100 nm, stop precision of the stage is 100 nm, and an allowable range of the deviation amount of the stage in vertical and horizontal directions is 25%, the upper limit of the magnification can be set at 100 k. The magnification setting processing can be carried out by changing the magnification up to the maximum magnification allowable of the stage precision.

In the case where there is no magnification which becomes to be equal to or higher than the threshold value, even repeated up to the maximum magnification allowable by the stage precision, the magnification setting processing can be carried out repeatedly by re-setting a pixel number to be imaged or optical conditions. In this magnification setting processing, the magnification can also be determined by carrying out enlargement processing of the cut out image B' to the measured magnification MagA, and by carrying out pattern recognition as the measured image A.

Subsequently, setting processing of the frame number of an image is carried out.

Figure 5:
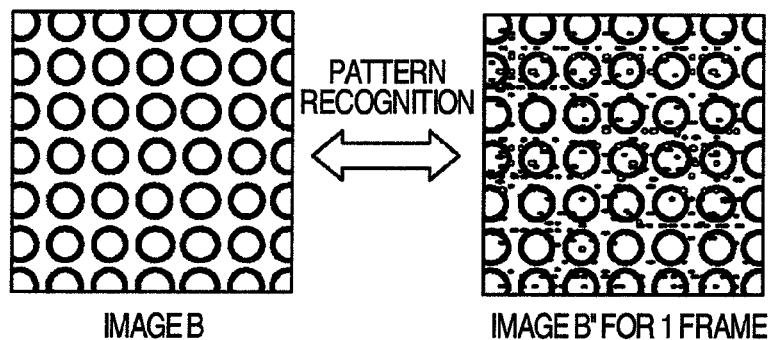
FIG. 5 is a drawing explaining an implementation example of pattern recognition between image to be searched area for pattern recognition and an image acquired when a frame number of the image of the relevant area is changed.

Firstly, in the step 2-9, a counter of the frame number is set at 1. In this way, the frame number is set at arbitrary number n by the step 2-10 from then on. In the step 2-11, the image B″ is acquired by setting the magnification at MagB and the frame number at the counter value. After that, in the step 2-12, as shown in FIG. 5, pattern recognition is carried out by means of the image B″ acquired and the image B. Pattern recognition can be carried out by means of the normalized correlation method.

Figure 6:
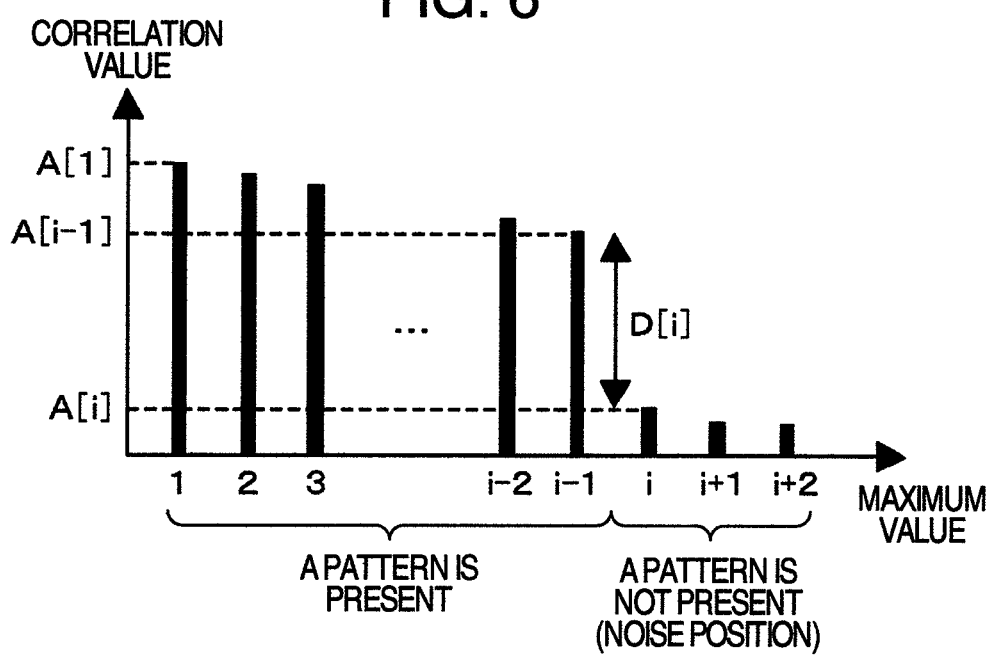
FIG. 6 is a graph where the maximum values of correlation value are put in the order of a score, in carrying out pattern recognition.

In the step 2-13, maximum values of the correlation value calculated in a range where pattern recognition was carried out, are searched, and in the step 2-14, they are aligned in the order of the larger correlation value, as shown in FIG. 6.

In the step 2-15, as shown in FIG. 6, difference D [i] of the adjoining correlation values A [i] and A [i−1] is calculated from the maximum values (1, 2, 3, - - - i) aligned in the order of the larger correlation value to determine the maximum value of D [i]. As shown in FIG. 6, it can be distinguished in such a way that a pattern is present at a position where the correlation value is higher than the correlation value of position where D [i] becomes the maximum value, and a pattern is not present at a position where the correlation value is lower.

In the step 2-16, from FIG. 6, because distinction is possible between the position where the pattern is present and the position where the pattern is not present, when A [i−1] is higher than the threshold value, it is judged that there is no error detection of the position of place where the pattern is not present in pattern recognition, and the frame number is set at the value set in the step 2-10. The threshold value should be acquired by determining an average value and a distribution value of the correlation value of the position where the pattern is not present, and by setting it as sum thereof. In addition, this threshold value can be set manually by a user.

When D [i−1] becomes lower than the threshold value, it becomes impossible to distinguish the position where the pattern is present and the position where the pattern is not present in pattern recognition, which may sometimes generate the case of error detection in pattern position detection. In this case, the frame number setting processing is carried out again by increasing the frame number by one, in the step 2-17. This processing can be carried out repeatedly number of times of frame in acquiring the measured image.

When pattern recognition is carried out using an image (low frame number) having large noise amount, the correlation value becomes low, and difference of the correlation value between the noise part without a pattern and the pattern part becomes small, which may results in wrong detection of the positions of the pattern and the noise. On the contrary, a pattern with low noise amount tends to increase the correlation value, and difference of the correlation value between the noise part without the pattern and the pattern part becomes large, therefore correct position can be detected.

In the step 2-18, the threshold value of pattern recognition in actual detection processing of measured pattern position is set. By setting the threshold value at equal to or larger than the sum of the average value and the distribution value of the correlation value of the position, where the pattern is not present in FIG. 6, error detection of the length measurement position in practical pattern recognition can be prevented.

Lastly, in the step 2-19, the image B as the template in pattern recognition, MagB [m] as the magnification and n as the frame number are registered as parameters in automatic length measurement.

Figure 7:
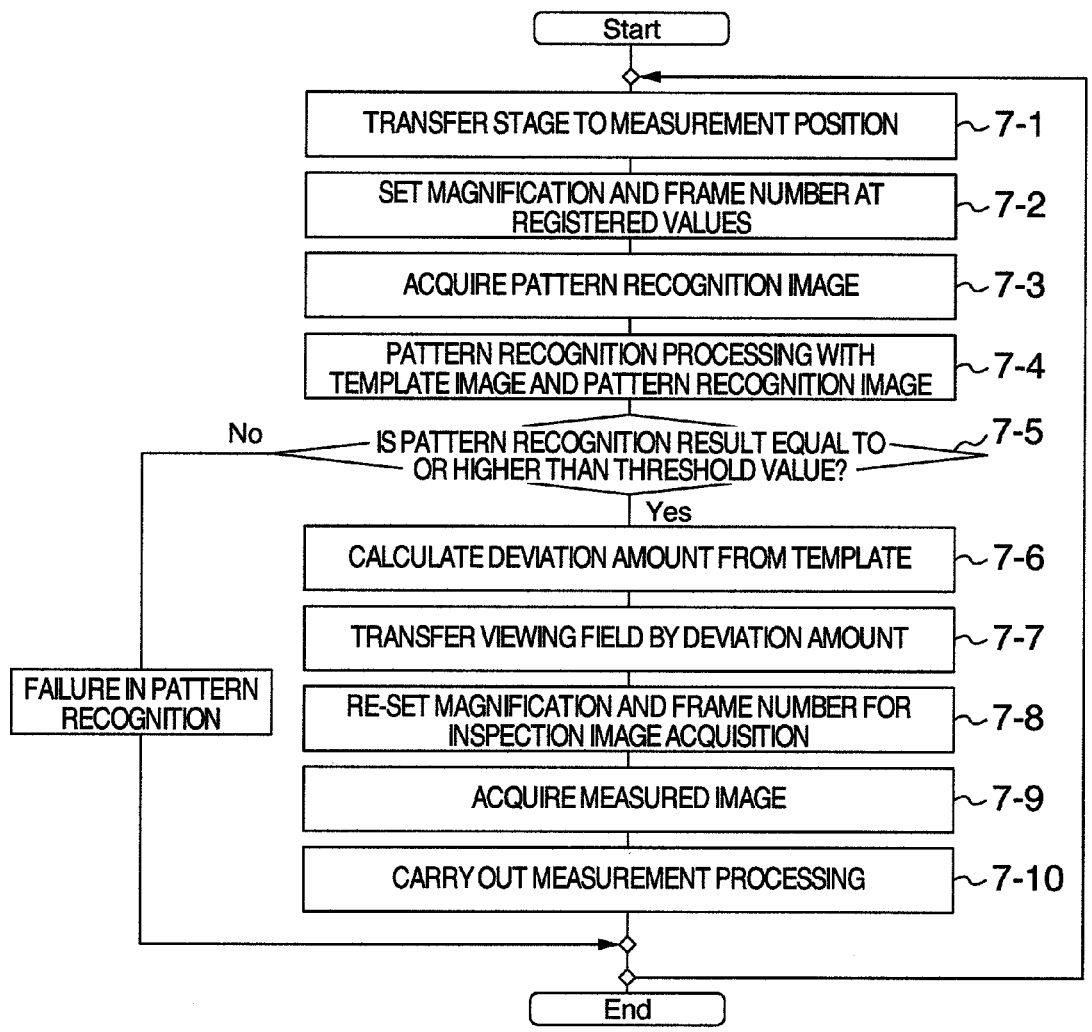
FIG. 7 is a flowchart explaining pattern recognition processing steps for measurement and detection of an inspection position to be applied in carrying out automatic measurement.

Explanation will be given next on processing flow in actual automatic measurement, with reference to FIG. 7. Firstly, in the step 7-1, a stage is transferred to the measurement position.

Next, in the step 7-2, the magnification and the frame number registered in pattern registration are set, and in the step 7-3, an image at the position where the stage was transferred is acquired.

In the step 7-4, pattern recognition is carried out by means of an image taken an imaging and the template. In the step 7-5, when pattern recognition result is equal to or higher than the threshold value determined in the step 2-18, deviation amount between the template image and the pattern recognition image is calculated in the step 7-6. In the case where the result becomes equal to or lower than the threshold value, it is judged as failure of pattern recognition, and the process is moved to the next measurement position in the step 7-5. Here, reason for failure of pattern recognition is considered non-focusing or non stopping of the stage at the objective position or the like. In the case of failure here, it may also be possible to carry out automatic focusing, acquire an image at the circumference of the measured position and carry out pattern recognition again.

After the success in pattern recognition, and calculation of deviation amount between the template and the measured image, the viewing field is transferred by the deviation amount, in the step 7-7. After that, imaging conditions of measurement image are set in the step 7-8, and the measurement image is taken as imaging in the step 7-9.

In the step 7-10, predetermined measurement is carried out using the image taken as imaging, and the stage is transferred to the next measuring point.

It is clear for those skilled in the art that, although the above description has been made on Embodiments, the present invention is not limited thereto and various changes and modifications can be made within a range the spirit of the present invention and the scope of the appended claims.

| [Reference Signs List] | |
|---|---|
| 1 | Electron gun |
| 2 | Heating filament |
| 3 | Mirror body of a scanning electron microscope |
| 4 | Wehnelt |
| 5 | Anode |
| 6 | Condenser lens |
| 7 | Scanning deflector |
| 8 | Electron beam |
| 9 | Objective lens |
| 10 | Sample chamber |
| 11 | Sample |
| 12 | Magnification adjuster |
| 13 | Camera |
| 14 | CRT |
| 15 | Adjustment circuit |
| 16 | Deflected signal generator |
| 17 | Secondary electrons detector |
| 18 | Amplifier |

The invention claimed is:

1. A method for setting pattern-searching condition for specifying a desired pattern on a sample, comprising the steps of:
   acquiring a first image obtained by scanning a charged particle beam at a first magnification;
   acquiring at a second magnification lower than the first magnification a second image which contains a pattern image displayed on the first image;
   making a size of the first image coincident with a size of a third image which cut out a portion of the second image, and
   setting the second magnification as a magnification in acquiring an image to be searched in the pattern searching in the case where a correlation value between the both is equal to or higher than the predetermined value.

2. The method for setting pattern-searching condition according to claim 1, wherein judgment of the predetermined value is carried out based on the correlation value, while setting the second magnification to a higher magnification gradually, and the second magnification when the relevant correlation value becomes equal to or higher than the predetermined value, is set as the magnification in acquiring the image to be searched in the pattern searching.

3. The method for setting pattern-searching condition according to claim 1, wherein a frame number is set based on comparison between the image acquired at the second magnification set as the magnification in acquiring the image to be searched in the pattern searching, and the image at the second magnification acquired by the predetermined frame number.

4. The method for setting pattern-searching condition according to claim 3, wherein, a value is selected as the frame number, in which difference between the correlation value at a place where a pattern is present and the correlation value at a place where a pattern is not present, becomes equal to or higher than the predetermined value, as for the correlation value between the two images.

5. A device for setting pattern-searching condition connected to a scanning electron microscope, for setting a pattern searching condition in the scanning electron microscope, the setting device is provided with a calculation device, wherein the calculation device acquires a first image obtained by scanning charged particle beam at a first magnification, and acquires at a second magnification lower than the first magnification a second image which contains a pattern image displayed on the first image, makes a size of the first image coincident with a size of a third image which cut out a portion of the second image, and sets the second magnification as a magnification in acquiring an image to be searched in the pattern searching in the case where a correlation value between the both is equal to or higher than a predetermined value.

6. The device for setting pattern-searching condition according to claim 5, wherein the calculation device judges the predetermined value based on the correlation value, while setting the second magnification to a higher magnification gradually, and sets the second magnification when the relevant correlation value becomes equal to or higher than the predetermined value as the magnification in acquiring the image to be searched in the pattern searching.

7. The device for setting pattern-searching condition according to claim 5, wherein the calculation device sets the number of frames based on comparison between the image acquired at the second magnification set as the magnification in acquiring the image to be searched in the pattern searching, and the image at the second magnification acquired by the predetermined frame number.

8. The device for setting pattern-searching condition according to claim 7, wherein the calculation device selects the number of frames in which difference between the correlation value at a place where a pattern is present and the correlation value at a place where a pattern is not present, becomes equal to or higher than the predetermined value, as for the correlation value between the two images.

* * * * *